US010325660B2

(12) United States Patent
Hama

(10) Patent No.: US 10,325,660 B2
(45) Date of Patent: Jun. 18, 2019

(54) SEMICONDUCTOR MEMORY DEVICE

(71) Applicants: Kabushiki Kaisha Toshiba, Minato-ku, Tokyo (JP); Toshiba Electronic Devices & Storage Corporartion, Minato-ku, Tokyo (JP)

(72) Inventor: Kaoru Hama, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/923,229

(22) Filed: Mar. 16, 2018

(65) Prior Publication Data
US 2019/0096486 A1 Mar. 28, 2019

(30) Foreign Application Priority Data
Sep. 22, 2017 (JP) .................................. 2017-182256

(51) Int. Cl.
*G11C 16/10* (2006.01)
*G11C 16/26* (2006.01)
*G11C 16/04* (2006.01)

(52) U.S. Cl.
CPC .......... *G11C 16/10* (2013.01); *G11C 16/0433* (2013.01); *G11C 16/26* (2013.01)

(58) Field of Classification Search
CPC ...... G11C 16/10; G11C 16/26; G11C 16/0433
USPC .................................................... 365/185.17
See application file for complete search history.

(56) References Cited

U.S. PATENT DOCUMENTS

| 5,959,930 | A | * | 9/1999 | Sakurai | ..................... | G11C 8/12 |
| | | | | | | 365/230.03 |
| 6,111,807 | A | * | 8/2000 | Ooishi | ...................... | G11C 7/22 |
| | | | | | | 365/189.05 |
| 6,301,169 | B1 | * | 10/2001 | Kikuda | ................ | G11C 7/1006 |
| | | | | | | 365/189.02 |
| 2001/0050861 | A1 | * | 12/2001 | Yamauchi | .......... | G11C 16/3454 |
| | | | | | | 365/185.11 |
| 2002/0004923 | A1 | | 1/2002 | Haraguchi | | |
| 2002/0131307 | A1 | * | 9/2002 | Murai | ................ | G11C 29/1201 |
| | | | | | | 365/200 |

(Continued)

FOREIGN PATENT DOCUMENTS

| JP | H11-066841 A | 3/1999 |
| JP | 2002-025298 A | 1/2002 |
| JP | 2012-119018 A | 6/2012 |

*Primary Examiner* — Sung Il Cho
(74) *Attorney, Agent, or Firm* — White & Case LLP

(57) ABSTRACT

In a semiconductor memory device of an embodiment, a write circuit includes an inversion circuit configured to invert write data and output the inverted write data, a first switch configured to pass or stop a current for programming a first memory cell in the first memory cell array to a selected bit line of the first memory cell array, a second switch configured to pass or stop a current for programming a second memory cell in the second memory cell array to a selected bit line of the second memory cell array, and a gate circuit configured to program one of the first memory cell and the second memory cell, and unprogram another of the first memory cell and the second memory cell simultaneously, by controlling the first switch based on the write data and controlling the second switch based on the inverted write data.

8 Claims, 6 Drawing Sheets

(56) References Cited

U.S. PATENT DOCUMENTS

| | | | | |
|---|---|---|---|---|
| 2003/0043664 A1* | 3/2003 | Haraguchi | ............. | G11C 29/44 365/201 |
| 2004/0049724 A1* | 3/2004 | Bill | ........................ | G11C 29/16 714/733 |
| 2007/0266279 A1* | 11/2007 | Kawano | ................. | G11C 29/26 714/721 |
| 2012/0134203 A1 | 5/2012 | Miura et al. | | |

* cited by examiner

SEMICONDUCTOR MEMORY DEVICE

CROSS-REFERENCE TO RELATED APPLICATION

This application is based upon and claims the benefit of priority from the prior Japanese Patent Applications No. 2017-182256, filed on Sep. 22, 2017; the entire contents of which are incorporated herein by reference.

FIELD

Embodiments described herein relate generally to a semiconductor memory device.

BACKGROUND

Conventionally, a memory of a multi-block configuration that suppresses an increase in size by sharing a readout circuit and a write circuit between two memory cell arrays has been sometimes adopted. As the memory cell arrays for use in the memory of the multi-block configuration, a random accessible nonvolatile memory, for example, a NOR type flash memory may be adopted.

In the flash memory, for example, a state where an electric charge is accumulated in a floating gate (FG) of a memory cell is set as a logical value "0", and a state where no electric charge is accumulated is set as a logical value "1". In order to perform writing to respective memory cells, electric charges need to be removed from the FGs temporarily, and erasure to initialize the respective memory cells to "1" is performed by applying a high voltage to erase gates (EG) of the respective memory cells. At the time of writing, injection of electric charges is not performed (hereinafter, referred to as unprogramming) in order to keep the memory cells at the logical value "1", or electric charges are injected to the FGs to change the respective memory cells from the logical value "1" to "0" (hereinafter, referred to as programming).

However, in a nonvolatile memory, a relatively long time period is required for programming. Consequently, the nonvolatile memory has a problem that a test time period becomes long, and test cost increases.

DETAILED DESCRIPTION

A semiconductor memory device according to an embodiment is a semiconductor memory device of a multi-block configuration that controls reading and writing of respective memory cells of first and second memory cell arrays by a common readout circuit and write circuit, wherein the write circuit includes an inversion circuit configured to invert write data and output the inverted write data, a first switch configured to pass or stop a current for programming a first memory cell in the first memory cell array to a selected bit line of the first memory cell array, a second switch configured to pass or stop a current for programming a second memory cell in the second memory cell array to a selected bit line of the second memory cell array, and a gate circuit configured to program one of the first memory cell and the second memory cell, and unprogram another of the first memory cell and the second memory cell simultaneously, by controlling the first switch based on the write data and controlling the second switch based on the inverted write data.

Hereinafter, embodiments of the present invention will be described in detail with reference to the drawings.

First Embodiment

Figure 1:
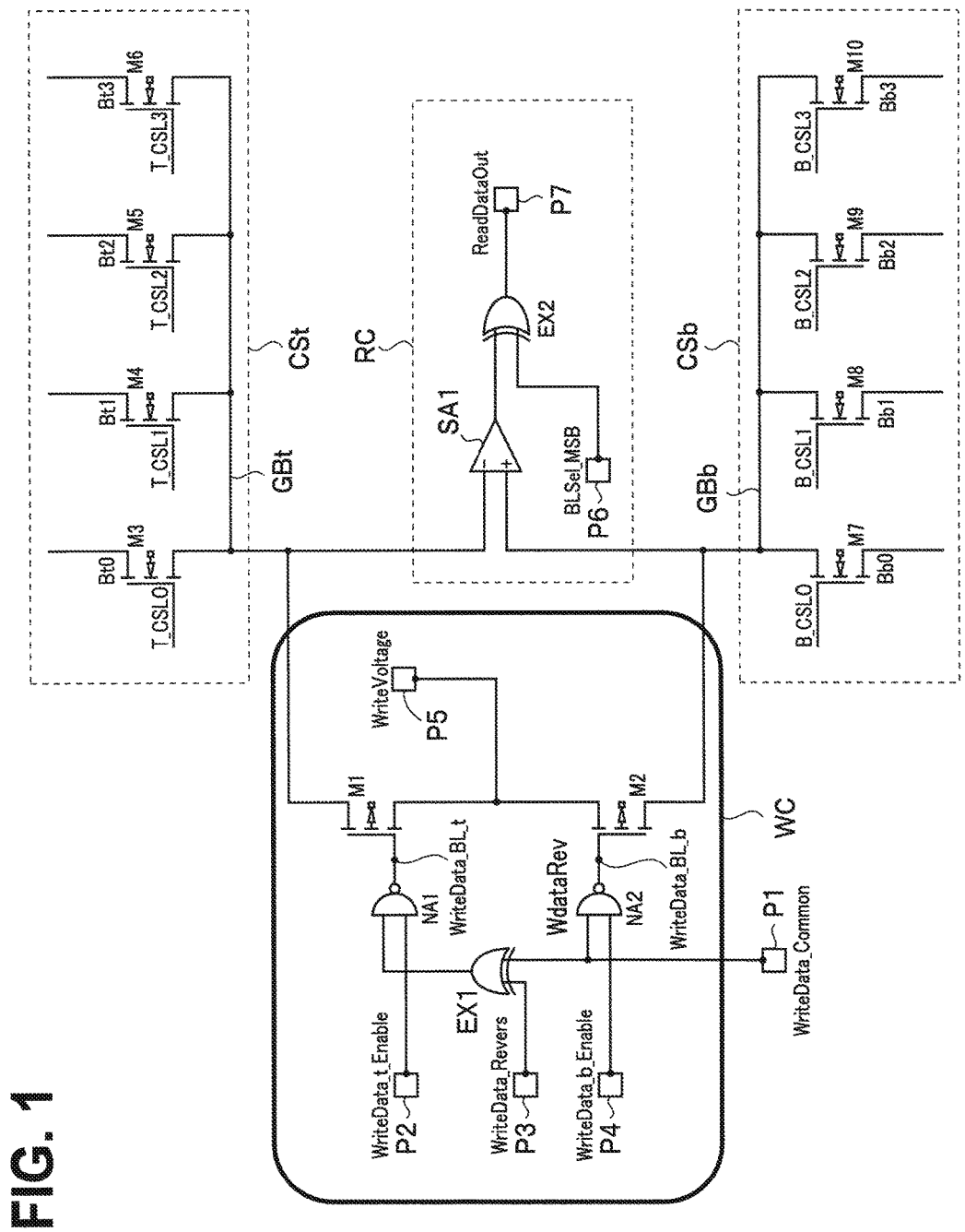
FIG. 1 is a circuit diagram illustrating a semiconductor memory device according to a first embodiment of the present invention.
Figure 2:
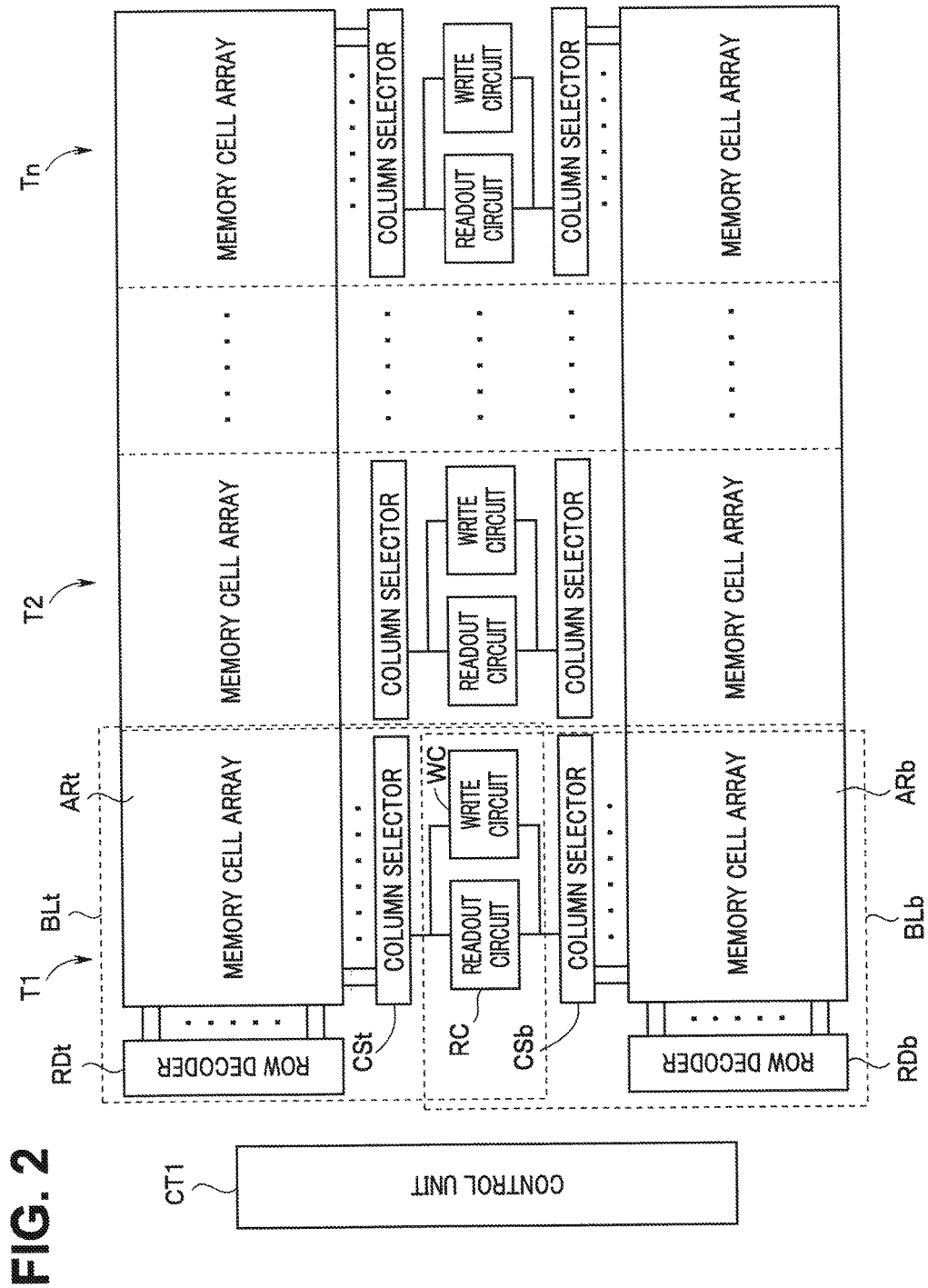
FIG. 2 is a block diagram illustrating an example of an entire configuration of the semiconductor memory device of the first embodiment.
Figure 3:
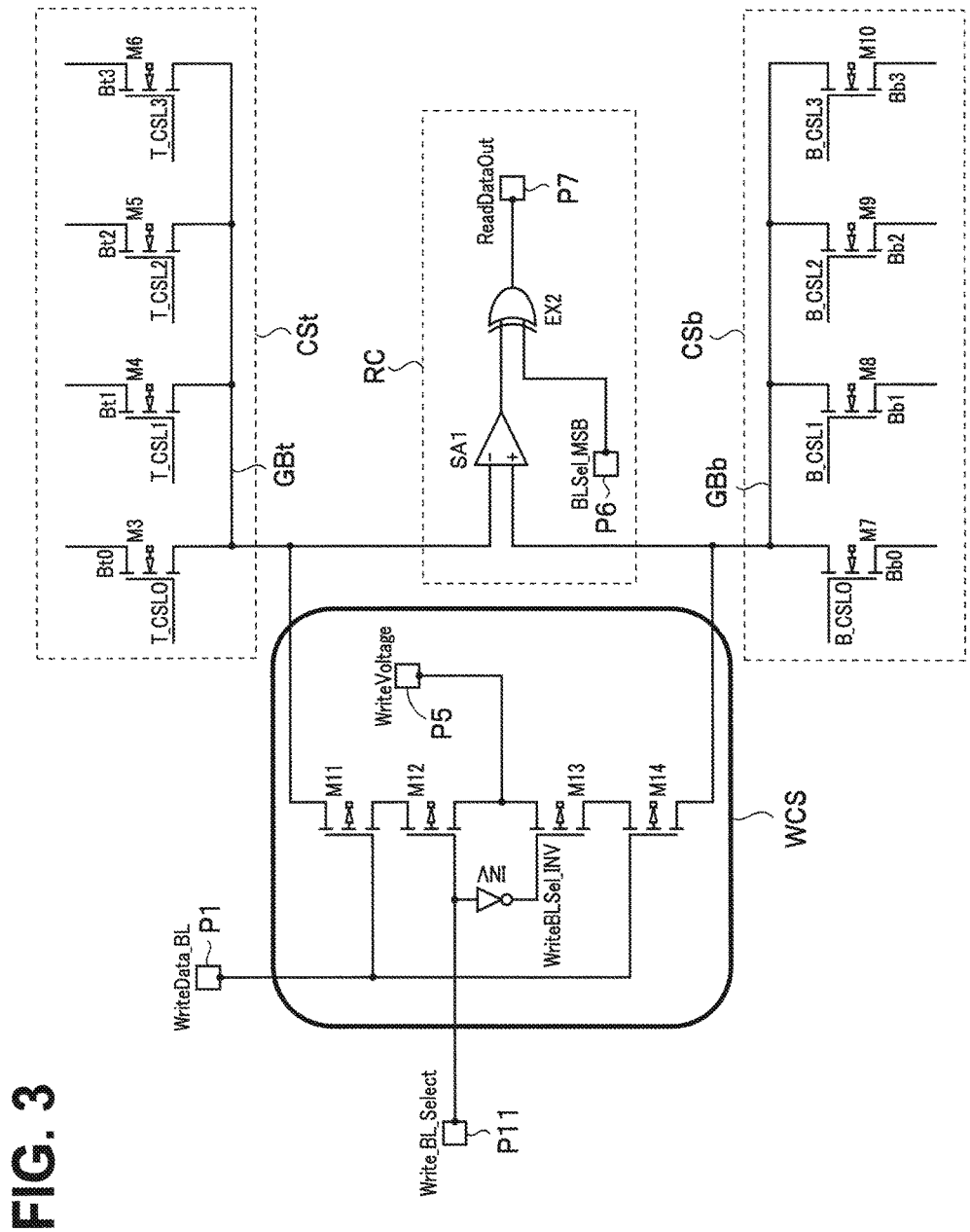
FIG. 3 is a circuit diagram illustrating a related art.

FIG. 1 is a circuit diagram illustrating a semiconductor memory device according to a first embodiment of the present invention. FIG. 2 is a block diagram illustrating an example of an entire configuration of the semiconductor memory device of the first embodiment. Note that FIG. 1 illustrates parts corresponding to a readout circuit, a write circuit and a column selector in FIG. 2. Further, FIG. 3 is a circuit diagram illustrating a related art. Note that a substrate electric potential of an NMOS transistor described later is set at VSS, and a substrate electric potential of a PMOS transistor is set at a voltage higher than a write voltage WriteVoltage, whereby the PMOS transistor operates, and in FIGS. 1, 3, 5 and 6, illustration of substrate connection of the transistors will be omitted.

The semiconductor memory device in FIG. 2 is, for example, a nonvolatile memory, and has a memory cell array ARt and a memory cell array ARb that are configured by nonvolatile memory cells. The memory cell arrays ARt and ARb are configured by memory cells being disposed in matrix shapes to correspond to intersections of a plurality of word lines and a plurality of bit lines. The respective word lines of the memory cell array ARt are driven by a row decoder RDt, and the respective word lines of the memory cell array ARb are driven by a row decoder RDb. Further, the respective bit lines of the memory cell array ARt are driven by a column selector CSt, and the respective bit lines of the memory cell array ARb are driven by a column selector CSb.

An upper block BLt is configured by the memory cell array ARt, the row decoder RDt, the column selector CSt, a readout circuit RC and a write circuit WC. Further, a lower block BLb is configured by the memory cell array ARb, the row decoder RDb, the column selector CSb, the readout circuit RC and the write circuit WC. That is, the semiconductor memory device in FIG. 2 is of a multi-block configuration in which the readout circuit RC and the write circuit WC are commonly used by the upper block BLt and the lower block BLb. By the upper block BLt and the lower block BLb, an I/O unit T1 in which one-bit data is outputted from the memory cell arrays ARt and ARb is configured.

I/O units T2 to Tn share the row decoders RDt and RDb with the I/O unit T1, and the word lines are common to the I/O units T1 to Tn. The I/O units T2 to Tn have same configurations as the I/O unit T1 except for the point that the row decoders RDt and RDb are omitted. Note that the semiconductor memory device in FIG. 2 shows an example configured by a plurality of I/O units, but may be configured by only one I/O unit.

The row decoders RDt and RDb, the column selectors CSt and CSb, the readout circuit RC and the write circuit WC are controlled by a control unit CT1. The control unit CT1 controls the respective parts to set respective modes of erase, read and write to the memory cell arrays ARt and ARb. For example, the control unit CT1 performs processing for designating addresses of the memory cell arrays ARt and ARb, processing of determining signals and voltages that are supplied to terminals P1 to P6 in FIG. 1 and the like.

In the memory cell arrays ARt and ARb, nonvolatile memory cells, for example, NOR-type flash memory cells are configured. The memory cells configured in the memory cell arrays ARt and ARb each has, for example, a MOS transistor structure including a floating gate (FG), when electric charges are accumulated in the FG, a current does not flow between a drain and a source, and this state is set as a logical value "0", whereas when no electric charge is accumulated in the FG, a current flows between the drain and source, the state is set as a logical value "1" and data is stored. By applying a high voltage to erase gates (EG) of the respective memory cells, electric charges are removed from the FGs, and erasure to initialize the logical value to "1" is enabled. Accordingly, at a time of erasure, it is not necessary to pass a current to the MOS transistor of the memory cell, and all of the memory cells also can be erased simultaneously.

Reading, programming and unprogramming of the memory cells are controlled by the write circuit WC. At a time of reading, for example, the write circuit WC precharges the bit lines. The drain of a transistor (a memory cell transistor) configuring the memory cell is connected to the bit line, and the source is connected to a reference electric potential point. Accordingly, if the bit lines are precharged, a bit line output voltage that is supplied to the readout circuit RC changes in accordance with conduction and non-conduction of the memory cell transistor, and reading of the data is enabled.

The programming to the nonvolatile memory cell, that is, electric charge injection to the FG is enabled by passing a predetermined current (for example, 1 μA) to the MOS transistor configuring the memory cell. The word line is selected by the row decoders RDt and RDb, the bit line is selected by the column selectors CSt and CSb, and a current is passed to the memory cell transistor connected to the selected word line and bit line by the write circuit WC, whereby an electric charge is injected into the FG, and the logical value of the memory data of the memory cell becomes "0".

Note that when the write circuit WC does not pass the current to the memory cell transistor selected by the word line and the bit line, an electric charge is not injected to the FG (unprogramming), and the logical value of the memory data of the memory cell remains to be "1".

In this way, in the nonvolatile memory, by passing the current to the transistor configuring the memory cell, programming by the electric charge injection to the FG is performed.

FIG. 1 illustrates examples of specific configurations of the column selectors CSt and CSb, the readout circuit RC and the write circuit WC in FIG. 2. Note that FIG. 1 illustrates an example in which a number of bit lines is four, but the number of bit lines is not specially limited.

The column selector CSt is configured by NMOS transistors M3 to M6 that are switches that control connection of the respective bit lines of the memory cell array ARt and the readout circuit RC, and the column selector CSb is configured by NMOS transistors M7 to M10 that are switches that control connection of the respective bit lines of the memory cell array ARb and the readout circuit RC.

Bit lines Bt0 to Bt3 of the upper block BLt are respectively connected to drains of the NMOS transistors M3 to M6 which respectively configure the column selector CSt. Sources of the transistors M3 to M6 are commonly connected to an inverted input terminal of a sense amplifier SA1 that configures the readout circuit RC via a global bit line GBt. The transistors M3 to M6 are selectively turned on by selection signals T_CSL0 to T_CSL3 that are respectively supplied to gates, and data (a bit line output) from the bit line connected to the transistor which is turned on is supplied to the inverted input terminal of the sense amplifier SA1.

Bit lines Bb0 to Bb3 of the lower block BLb are respectively connected to drains of the NMOS transistors M7 to M10 that respectively configure the column selector CSb. Sources of the transistors M7 to M10 are commonly connected to a non-inverted input terminal of the sense amplifier SA1 that configures the readout circuit RC via a global bit line GBb. The transistors M7 to M10 are selectively turned on by selection signals B_CSL0 to B_CSL3 that are respectively supplied to gates, and data from the bit line connected to the transistor which is turned on is supplied to the non-inverted input terminal of the sense amplifier SA1.

As described above, the write circuit WC precharges the bit lines at the time of reading, and passes a current to the memory cell transistor via the bit line at the time of programming. When an electric charge is present in the FG of the memory cell transistor selected by the word line and the bit line, the drain and source of the memory cell transistor are not electrically continuous, and the voltage by precharge is supplied to the inverted input terminal or the non-inverted input terminal of the sense amplifier SA1 of the readout circuit RC. Further, when no electric charge is present in the FG of the memory cell transistor selected by the word line and the bit line, the drain and the source of the memory cell transistor are electrically continuous, the precharge current flows to the reference electric potential point from the source of the memory cell transistor and the electric potential of the inverted input terminal or the non-inverted input terminal of the sense amplifier SA1 becomes the reference potential.

The sense amplifier SA1 obtains a difference between a bit line output of the upper block BLt and a bit line output of the lower block BLb and outputs the difference to an EXOR circuit EX2. To the EXOR circuit EX2, a selection signal BLSel_MSB for selecting a block is also given from a terminal P6. The selection signal BLSel_MSB is "0" at a time of selection of the upper block BLt, and is "1" at a time of selection of the lower block BLt.

When an electric charge is present in the FG of the selected memory cell of the upper block BLt, a voltage (the logical value "1") by precharge is supplied to the non-inverted input terminal of the sense amplifier SA1, so that the output of the sense amplifier SA1 is "0". Further, when no electric charge is present in the FG of the selected memory cell of the upper block BLt, the reference electric potential (the logical value "0") is supplied to the inverted input terminal of the sense amplifier SA1, so that the output of the sense amplifier SA1 is "1". At the time of selection of the upper block BLt, the output of the sense amplifier SA1 is directly outputted to an output terminal P7 as ReadDataOut via the EXOR circuit EX2.

Further, when an electric charge is present in the FG of the selected memory cell of the lower block BLb, a voltage (the logical value "1") by precharge is supplied to the non-inverted input terminal of the sense amplifier SA1, so that the output of the sense amplifier SA1 is "1". Further, when no electric charge is present in the FG of the selected memory cell of the upper block BLb, the reference electric potential (the logical value "0") is supplied to the non-inverted input terminal of the sense amplifier SA1, so that the output of the sense amplifier SA1 is "0". At a time of selection of the lower block BLb, the output of the sense amplifier SA1 is inverted by the EXOR circuit EX2 and is outputted to the output terminal P7 as ReadDataOut.

Next, before describing the write circuit WC in FIG. 1, a configuration of a write circuit WCS which is adopted in the related art will be described with reference to FIG. 3. Note that in the related art in FIG. 3, configurations of the column selectors CSt and CSb and the readout circuit RC are similar to the configurations in FIG. 1.

In FIG. 3, write data WriteDate_BL which is written to the respective memory cells of the memory cell arrays ARt and ARb is supplied to a terminal P1. The data WriteDate_BL is supplied to gates of transistors M11 and M14. Further, a block selection signal Write_BL_Select for selecting the upper block BLt or the lower block BLb is supplied to a terminal P11. The block selection signal Write_BL_Select is "0" at the time of selection of the upper block BLt, and is "1" at the time of selection of the lower block BLt. The block selection signal Write_BL_Select is supplied to a gate of a PMOS transistor M12, and is supplied to a gate of a PMOS transistor M13 after being inverted by an inverter INV.

A write voltage WriteVoltage necessary to program the respective memory cells is supplied to a terminal P5. Supply of the write voltage WriteVoltage of the terminal 5 to respective bit lines of the upper block BLt is controlled by the transistors M11 and M12, and supply of the write voltage WriteVoltage to respective bit lines of the lower block BLb is controlled by the transistors M13 and M14.

At the time of selection of the upper block BLt, the transistor M12 is on, and the transistor M13 is off. In this case, when the data WriteDate_BL is at a high level (hereinafter, referred to as an H level) (the logical value "1"), the transistor M11 is off, and the write voltage WriteVoltage is not applied to the respective bit lines of the upper block BLt. Accordingly, in this case, the selected memory cell of the upper block BLt is unprogrammed, and the logical value "1" remains to be stored. Further, when the data WriteDate_BL is at a low level (hereinafter, referred to as an L level) (the logical value "0") at the time of the upper block BLt being selected, the transistor M11 is on, the write voltage WriteVoltage is applied to the respective bit lines of the upper block BLt and a current for writing flows. Accordingly, in this case, the selected memory cell of the upper block BLt is programmed, and the logical value "0" is stored.

At the time of the lower block BLb being selected, the transistor M12 is off, and the transistor M13 is on. In this case, when the data WriteDate_BL is at a H level, the transistor M14 is off, and the write voltage WriteVoltage is not applied to the respective bit lines of the lower block BLb. Accordingly, in this case, the selected memory cell of the lower block BLb is unprogrammed, and the logical value "1" remains to be stored. Further, when the data WriteDate_BL is at an L level at the time of the lower block BLb being selected, the transistor M14 is on, the write voltage WriteVoltage is applied to the respective bit lines of the lower block BLb, and a current for writing flows. Accordingly, in this case, the selected memory cell of the lower block BLb is programmed, and the logical value "0" is stored.

As described above, at the time of programming, it is necessary to pass a current to the memory cell transistor. Consequently, in the nonvolatile memory, a time period required to read out data is of an ns order, whereas a time period required for programming is of a is order and is extremely long, and a long time period is required for test.

In addition, in the related art in FIG. 3, a current for writing exclusively flows into the bit line of the upper block BLt and the bit line of the lower block BLb by the write circuit WCS, so that programming cannot be simultaneously performed to both the blocks BLt and BLb. Consequently, in the related art in FIG. 3, a relatively long time period is required as the test time period.

Thus, a method of simultaneous writing to both blocks of the upper block BLt and the lower block BLb may be adopted. However, when a test is performed by writing data of the same logical values to the memory cell array ARt of the upper block BLt and the memory cell array ARb of the lower block BLb, writing for determining whether or not block selection is normally performed is further needed, and the test time period cannot be shortened.

Thus, a method of making determination of block selection unnecessary by writing a diagonal pattern and an inverted pattern of the diagonal pattern to the memory cell array ARt of the upper block BLt and the memory cell array ARb of the lower block BLb respectively is conceivable. However, in the related art in FIG. 3, only the same data can be written to the memory cell array ARt of the upper block BLt and the memory cell array ARb of the lower block BLb even if the transistors M12 and M13 are always turned on in the test mode, and in order to perform writing of the diagonal pattern and the inverted pattern of the diagonal pattern in the related art in FIG. 3, it is necessary to perform writing separately to the upper block BLt and the lower block BLb, so that the test time period cannot be shortened.

Note that a method of shortening the test time period by adopting a checked pattern as the test pattern may be adopted. Writing is performed by dividing rows into a row where all the bits are programmed and a row where no bit is programmed. In this case, it is necessary to pass a current corresponding to the number of cells which are simultaneously programmed, and a device size increases. Further, in this case, the same data is written to the upper block BLt and the lower block BLb, and it is necessary to further carry out a determination test of whether or not selection of the block is reliably performed. Note that a method of simultaneously programming a plurality of cells by increasing the time period for passing a current to the cells without increasing the current amount, in the simultaneous writing like this exists. However, the method only can shorten the test time period correspondingly to a time period by which a number of times of changing the voltage can be reduced. In addition, in the aforementioned diagonal pattern, the method of simultaneous writing to a plurality of rows cannot be adopted, because the pattern is different for each row.

That is, when writing is simultaneously performed to a plurality of memory cells having a common bit line in a nonvolatile memory, data of the same logical value is written. In other words, to a plurality of memory cells connected to different bit lines, data of different logical values from each other can be simultaneously written. In the present embodiment, the diagonal pattern and the inverted pattern of the diagonal pattern are for simultaneously performing writing to the upper block BLt and the lower block BLb without increasing a necessary current amount, by using the fact that the logical values are different from each other in the corresponding rows of the corresponding columns of the upper block BLt and the lower block BLb.

That is, the present embodiment enables the test time period to be shorten without increasing the current amount necessary for writing by simultaneously performing writing to program one memory cell and unprogram the other memory cell, to a pair of corresponding memory cells of the upper block BLt and the lower block BLb, in the nonvolatile semiconductor memory device of a multi-block configuration.

In FIG. 1, configurations of the column selectors CSt and CSb and the readout circuit RC are respectively the same as the configurations of the column selectors CSt and CSb and the readout circuit RC in FIG. 3. In FIG. 1, write data WriteDate_Common is inputted to the terminal P1. The write data WriteDate_Common is supplied to a NAND circuit NA2 and an EXOR circuit EX1.

Note that the write data WriteDate_Common is data for simultaneously writing data to a pair of memory cells of the memory cell arrays ARt and ARb at a time of a test mode. In the present embodiment, data of different logical values from each other are written to the memory cell of the memory cell array ARt of the upper block BLt and the corresponding memory cell of memory cell array ARb of the lower block BLb, so that the write data WriteDate_Common corresponds to the logical value of the data which is written to one of the memory cells.

An inversion control signal WriteData_Revers is inputted to the terminal P3, and the inversion control signal WriteData_Revers is supplied to the EXOR circuit EX1 as an inversion circuit. At the time of the test mode, the inversion control signal WriteData_Revers is "1". Accordingly, at the time of the test mode, the EXOR circuit EX1 inverts the write data WriteDate_Common. The EXOR circuit EX1 gives an output to a NAND circuit NA1. In a mode (hereinafter, referred to as a normal mode) at a time of using a memory that performs normal reading and writing, the inversion control signal WriteData_Revers is "0", and the EXOR circuit EX1 directly gives the write data WriteDate_Common to the NAND circuit NA1.

An enable signal WriteData_t_Enable for allowing writing to the memory cell of the memory cell array ARt is given to the terminal P2, and an enable signal WriteData_b_Enable for allowing writing to the memory cell of the memory cell array ARb is given to the terminal P4. The enable signal WriteData_t_Enable is given to the NAND circuit NA1, and the enable signal WriteData_b_Enable is given to the NAND circuit NA2. When writing is performed to the upper block BLt at the time of the normal mode, the enable signal WriteData_t_Enable is "1", and the enable signal WriteData_b_Enable is "0". Further, when writing is performed to the lower block BLb at the time of the normal mode, the enable signal WriteData_t_Enable is "0", and the enable signal WriteData_b_Enable is "1".

At the time of the test mode of the present embodiment, writing is simultaneously performed to the corresponding memory cells of the memory cell arrays ARt and ARb, so that at the time of the test mode, both the enable signals WriteData_t_Enable and WriteData_b_Enable are "1". Accordingly, at the time of the test mode, the data WriteData_BL_t corresponding to the write data WriteDate_Common is outputted from the NAND circuit NA1, and from the NAND circuit NA2, the data WriteData_BL_b corresponding to an inversion signal of the write data WriteDate_Common is outputted.

To the terminal P5, a write voltage WriteVoltage necessary to program the respective memory cells is supplied. The terminal P5 is commonly connected to the sources of the transistors M3 to M6 which configure the column selector CSt via a source/drain path of a PMOS transistor M1 as a first switch and the global bit line GBt, and is commonly connected to the sources of the transistors M7 to M10 which configure the column selector CSb via a source/drain path of a PMOS transistor M2 as a second switch and the global bit line GBb. To a gate of the transistor M1, the data WriteData_BL_t from the NAND circuit NA1 is supplied, and to a gate of the transistor M2, the data WriteData_BL_b from the NAND circuit NA2 is supplied.

The NAND circuits NA1 and NA2 configure gate circuits that control on and off of the transistors M1 and M2 which are the first and second switches. That is, at the time of the test mode, in the case of the write data WriteDate_Common being "1", the data WriteData_BL_t from the NAND circuit NA1 is "1", the data WriteData_BL_b from the NAND circuit NA2 is "0", the transistor M1 is off, and the transistor M2 is on, whereby the write voltage WriteVoltage is applied to the lower block BLb, so that the memory cell of the memory cell array ARb is programmed to be "0", and the corresponding memory cell of the memory cell array ARt of the upper block BLt is unprogrammed to remain to be "1".

Conversely, when the write data WriteDate_Common is "0" at the time of the test mode, the data WriteData_BL_t from the NAND circuit NA1 is "0", the data WriteData_BL_b from the NAND circuit NA2 is "1", the transistor M1 is on whereas the transistor M2 is off, the write voltage WriteVoltage is applied to the upper block BLt, the memory cell of the memory cell array ARt is programmed to be "0", and the corresponding memory cell of the memory cell array ARb of the lower block BLb is unprogrammed to remain to be "1".

In this way, in the present embodiment, it is possible to write data with different logical values from each other simultaneously to and store the data to the memory cell of the upper block BLt and the corresponding memory cell of the lower block BLb.

Note that in the circuit in FIG. 1, the write voltage WriteVoltage is configured to be applied to the sense amplifier SA1. In the sense amplifier SA1, a transistor with a low withstand voltage is normally adopted, so that a circuit for preventing the write voltage WriteVoltage from being applied to the sense amplifier SA1 may be provided, but the circuit is omitted as the withstand voltage of the sense amplifier SA1 is assumed to be sufficiently high.

Note that a substrate electric potential of the NMOS transistor is set at VSS. Further, a substrate electric potential of the PMOS transistor is set at a higher voltage than the write voltage WriteVoltage, and thereby the transistor that is used in writing operates at a higher electric potential than the write voltage WriteVoltage.

Figure 4:
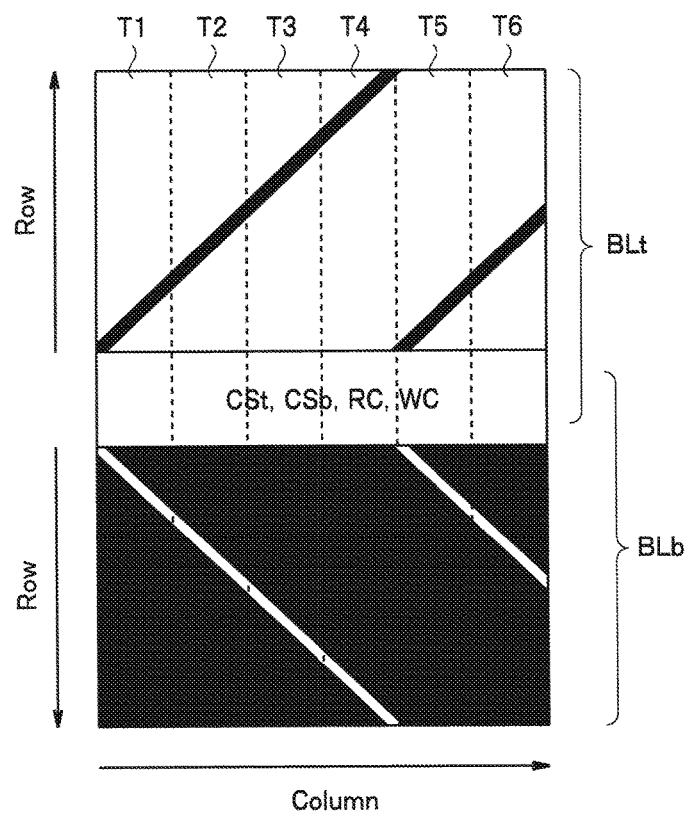
FIG. 4 is an explanatory diagram for explaining writing of a diagonal pattern and an inverted pattern of the diagonal pattern by plotting a column on a horizontal axis and plotting a row on a vertical axis.

Next, an operation of the embodiment configured in this way will be described with reference to FIG. 4. FIG. 4 is an explanatory diagram for explaining writing of a diagonal pattern and an inverted pattern of the diagonal pattern by plotting a column on a horizontal axis and plotting row on a vertical axis.

FIG. 4 is an example of "n" in FIG. 2 being six, and illustrates an example in which the semiconductor memory device is configured by six I/O units T1 to T6. FIG. 4 illustrates an example in which the memory cell arrays ARt and ARb each of a single I/O unit each has four bit lines and 16 word lines, for example. In FIG. 4, filling and void show that logical values different from each other are written. That is, the diagonal pattern in FIG. 4 is such that write data is set as "1" (or "0") each time an address of the memory cell array increases by one column and one row, and the other addresses are set as "0" (or "1"). Note that in a pattern of "1"

(or "0") of the diagonal pattern in FIG. 4, the row address continuously increases in a plurality of I/O units, but the pattern of "1" (or "0") may be completed from a first row address to a final row address of the single I/O unit. Further, numbers of the bit lines and the word lines are appropriately settable, and the diagonal pattern may be started from the bit line in a midpoint of the I/O unit.

Operations at times of erasure and reading are similar to the operations in the related art in FIG. 3, so that explanation will be omitted. In the present embodiment, at the time of writing in the test mode, for example, the diagonal pattern and the inverted pattern illustrated in FIG. 4 are written to the respective memory cell arrays ARt and ARb.

At the time of writing of the test pattern in FIG. 4, the control unit CT1 sets the enable signals WriteData_t_Enable and WriteData_b_Enable at "1", and sets the inversion control signal WriteData_Revers at "1", and applies the write voltage WriteVoltage to the terminal P5. Further, the control unit CT1 erases all the memory cells and sets the data at "1" before writing of the test pattern.

The control unit CT1 controls the row decoders RDt and RDb and the column selectors CSt and CSb, selects the word lines and the bit lines sequentially, and causes all the memory cells of all the memory cell arrays ARt and ARb of the I/O units T1 to T6 to be sequentially selected to perform programming or unprogramming. The control unit CT1 may adopt column first or may adopt row first, in selection of all the memory cells.

The control unit CT1 gives an instruction to the row decoder RDt and the column selector CSt to designate the memory cell address of the memory cell array ARt, and instructs the address corresponding to the address designated to the memory cell array ARt to the row decoder RDb and the column selector CSb. That is, designation of the address is performed in such a manner that at a timing when the row decoder RDt and the column selector CSt designate a first word line and an $m^{th}$ bit line of the memory cell array ARt, the row decoder RDb and the column selector CSb designate a first word line and an $m^{th}$ bit line of the memory cell array ARb. That is, at the time of writing in the test mode, in the memory cell arrays ARt and ARb, memory cells in the same position as each other are selected.

Now, the filled portions in FIG. 4 are assumed to be the pattern of "1", and void portions are assumed to be the pattern of "0", for example. Here, a memory cell (hereinafter, referred to as an upper block selection cell) in any one position in the filled portions of the upper block BLt in FIG. 4 is assumed to be selected. In this case, in the lower block BLb, a memory cell corresponding to a position of the upper block BLt, that is, a memory cell (hereinafter, referred to as a lower block selection cell) of the void portions is selected. In this case, the control unit CT1 gives the write data WriteDate_Common of "1" is given to the terminal P1. Then, the data WriteData_BL_t from the NAND circuit NA1 becomes "1", and the data WriteData_BL_b from the NAND circuit NA2 becomes "0". Thereby, the transistor M1 is turned off, whereas the transistor M2 is turned on, the write voltage WriteVoltage from the terminal P5 is applied to the bit line of the lower block BLb which is selected via the column selector CSb, programming of accumulating an electric charge to the FG of the lower block selection cell connected to the bit line and word line which are selected is performed, and the data of the memory cell becomes "0". Note that the upper block selection cell corresponding to the memory cell of the lower block BLb is unprogrammed to remain to be "1". In this way, "1" is written to the upper block selection cell at the filled position, and "0" is written to the lower block selection cell at the void position.

Next, the upper block selection cell is assumed to be a memory cell in any one position of the void portions in FIG. 4, and the lower block selection cell corresponding to the upper block selection cell is assumed to be a memory cell at the filled position in FIG. 4. In this case, the control unit CT1 gives the write data WriteDate_Common of "0" to the terminal P1. Then, the data WriteData_BL_t from the NAND circuit NA1 becomes "0", and the data WriteData_BL_b from the NAND circuit NA2 becomes "1". Thereby, the transistor M1 is turned on, whereas the transistor M2 is turned off, the write voltage WriteVoltage from the terminal P5 is applied to the bit line of the upper block BLt which is selected via the column selector CSt, programming of accumulating an electric charge in the FG of the upper block selection cell connected to the bit line and the word line which are selected is performed, and the data of the memory cell becomes "0". Note that the lower block selection cell corresponding to the memory cell of the upper block BLt is unprogrammed to remain to be "1". In this way, "0" is written to the upper block selection cell at the void position, and "1" is written to the lower block selection cell at the filled position.

In this way, writing of the test pattern in FIG. 4 is performed. Writing is performed simultaneously to the memory cell of the memory cell array ARt of the upper block BLt and the memory cell of the memory cell array ARb of the lower block BLb, so that as compared with a case where writing is performed to the respective memory cells one by one, the time period required for writing of the test pattern can be shortened to substantially ½. Further, one of the pair of memory cells to which writing is performed simultaneously is programmed, and the other one is unprogrammed, so that the current which is supplied to the two memory cells to which writing is performed simultaneously can be the current for one memory cell, and a circuit scale necessary to supply the current can be prevented from increasing.

In this way, in the present embodiment, writing to program one of the corresponding memory cells of the upper and lower blocks and unprogram the other one can be performed simultaneously. Thereby, the time period required to write the test pattern can be shortened. Since one of the two memory cells is programmed and the other one is unprogrammed, so that the current required to write to these two memory cells can be the current corresponding to the one memory cell, and the circuit scale required to supply the current can be restrained from increasing.

Note that the circuit in FIG. 1 shows the circuit in which when the write data WriteDate_Common is "0", the write voltage WriteVoltage is supplied to the bit line of the upper block BLt and the programming is performed. It is obvious to be able to easily realize the circuit in which the write data WriteDate_Common is given to the NAND circuit NA1, and the inversion signal of the write data WriteDate_Common is given to the NAND circuit NA2, so that when the write data WriteDate_Common is "0", the write voltage WriteVoltage is supplied to the bit line of the lower block BLb and the programming is performed.

Further, the present embodiment makes it possible to perform the writing to program one of the corresponding memory cells of the upper and lower blocks, and unprogram the other one simultaneously, and it is obvious that the test pattern that can be written in the present embodiment is not limited to FIG. 4. For example, it is possible to write "1" to all the memory cells of the upper block, and write "0" to all the memory cells of the lower block, and it is possible to write a pattern that is inverted with respect to the pattern that is written to the upper block, to the lower block.

Second Embodiment

Figure 5:
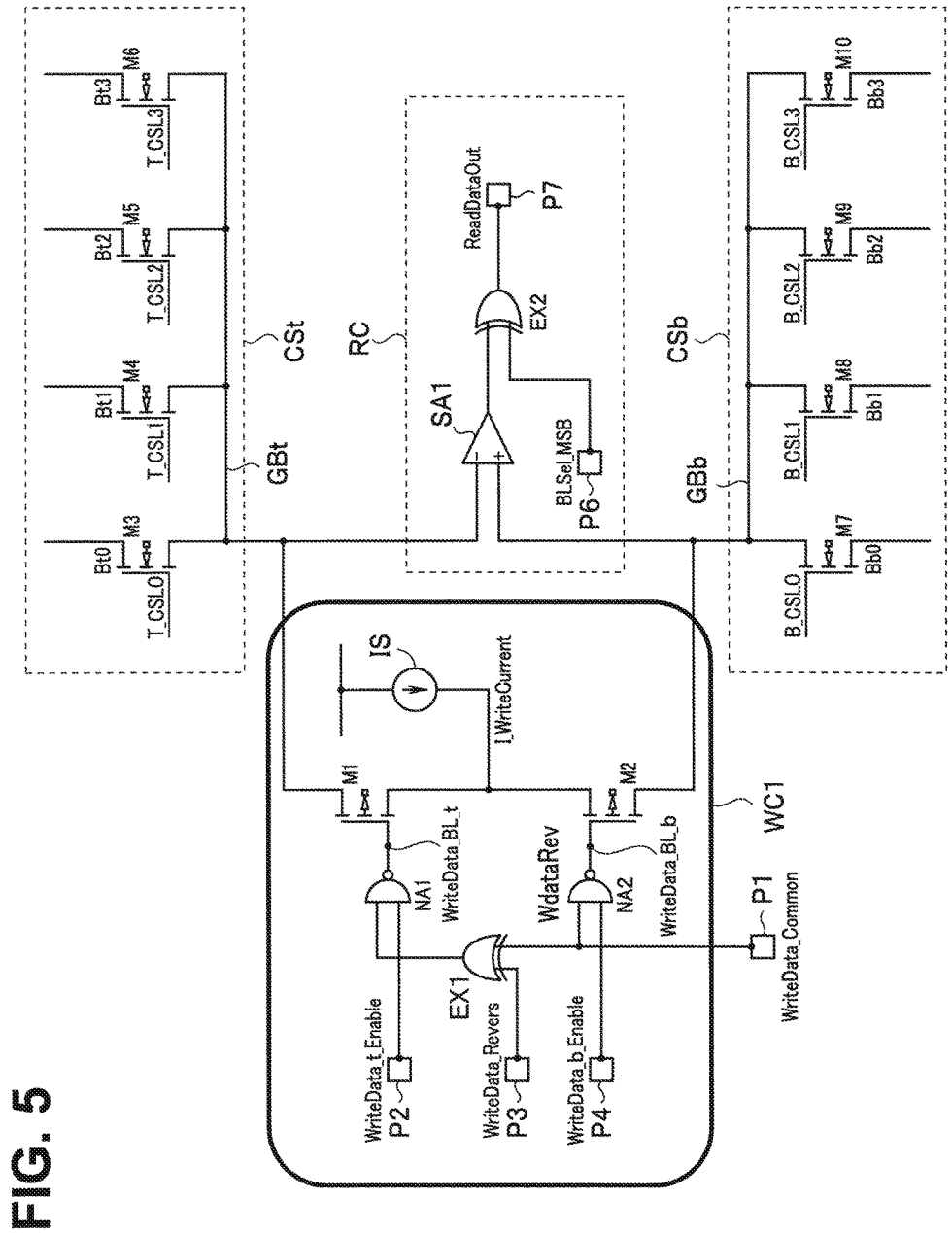
FIG. 5 is a circuit diagram illustrating a second embodiment of the present invention.

FIG. 5 is a circuit diagram illustrating a second embodiment of the present invention. In FIG. 5, the same components as the components in FIG. 1 will be assigned with the same reference signs, and explanation will be omitted.

The first embodiment injects an electric charge into the FG of the memory cell by applying the write voltage WriteVoltage to the bit line. In contrast with this, the present embodiment injects an electric charge into an FG of a memory cell by supplying a write current I_WriteCurrent to a bit line.

The circuit in FIG. 5 differs from the circuit in the first embodiment in a point that a write circuit WC1 is adopted instead of the write circuit WC in FIG. 4. The write circuit WC1 differs from the write circuit WC in a point that supply of the write voltage WriteVoltage is omitted, and a current source IS is adopted. The current source IS generates the write current I_WriteCurrent. When the transistor M1 is turned on, the current source IS supplies the write current I_WriteCurrent to the bit line of the upper block BLt which is selected by the column selector CSt, and when the transistor M2 is turned on, the current source IS supplies the write current I_WriteCurrent to the bit line of the lower block BLb which is selected by the column selector CSb. The respective memory cells of the memory cell arrays ARt and ARb accumulate electric charges in the FGs by the write current I_WriteCurrent which is supplied via the connected bit lines flowing to the respective memory cells.

The embodiment configured in this way differs from the first embodiment in a point that at a time of programming, the write current I_WriteCurrent from the current source IS is supplied to the selected bit line and the programming is performed. The other operations are similar to the operations in the first embodiment.

In this way, in the present embodiment, a similar effect to the effect of the first embodiment can be obtained. Further, when writing (programming and unprogramming) is performed simultaneously to the corresponding memory cells of the upper block and the lower block, the current amount required to write can be an amount for one memory cell, and a circuit scale of the current source can be prevented from increasing. Further, the current amount required to write does not change at the time of the test and at the time of the normal mode, so that it is not necessary to provide a plurality of current sources, a switch circuit for the current sources and the like.

Third Embodiment

Figure 6:
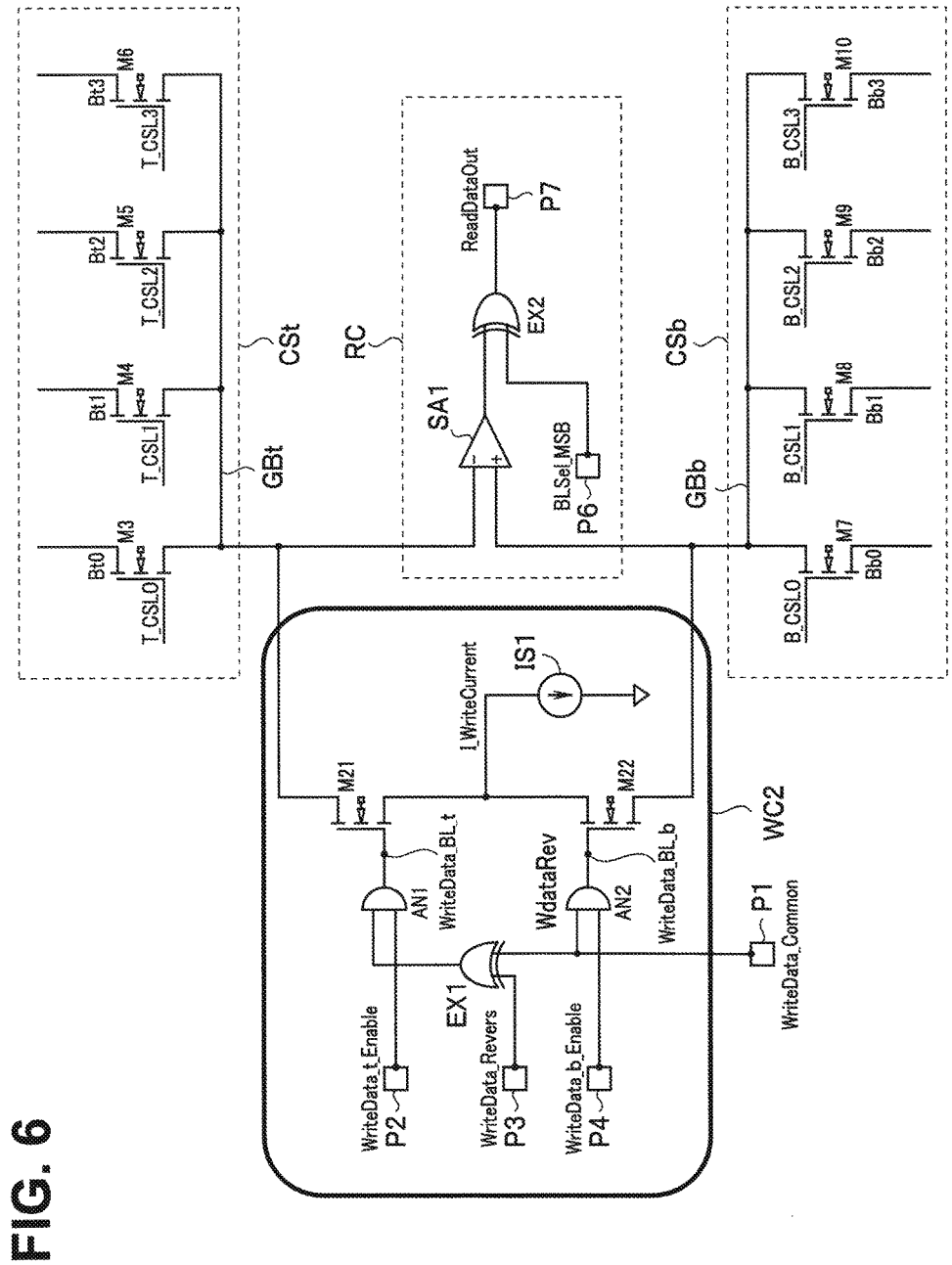
FIG. 6 is a circuit diagram illustrating a third embodiment of the present invention.

FIG. 6 is a circuit diagram illustrating a third embodiment of the present invention. In FIG. 6, the same components as the components in FIG. 5 will be assigned with the same reference signs, and explanation will be omitted.

The second embodiment injects an electric charge into the FG of the memory cell by supplying the write current I_WriteCurrent to the bit line, but the present embodiment injects an electric charge into an FG of a memory cell by extracting the write current I_WriteCurrent from the bit line.

A circuit in FIG. 6 differs from the second embodiment in a point that a write circuit WC2 is adopted instead of the write circuit WC1 in FIG. 5. The write circuit WC2 differs from the write circuit WC1 in FIG. 5 in a point that an AND circuit AN1 and an AND circuit AN2 are adopted respectively instead of the NAND circuit NA1 and the NAND circuit NA2, NMOS transistors M21 and M22 are adopted respectively instead of the PMOS transistors M1 and M2, and a current source IS1 is adopted instead of the current source IS.

To the AND circuit AN1, the enable signal WriteData_t_Enable from the terminal P2 and the output of the EXOR circuit EX1 are given, and to the AND circuit AN2, the enable signal WriteData_b_Enable from the terminal P4 and the write data WriteDate_Common from the terminal P1 are given.

At the time of a test mode, the data WriteData_BL_t corresponding to an inversion signal of the write data WriteDate_Common is outputted from the AND circuit AN1, and the data WriteData_BL_b corresponding to the write data WriteDate_Common is outputted from the AND circuit AN2.

The data WriteData_BL_t from the AND circuit AN1 is supplied to a gate of the NMOS transistor M21, and the data WriteData_BL_b from the AND circuit AN2 is supplied to a gate of the NMOS transistor M22. Sources of the transistors M21 and M22 are commonly connected and connected to a reference electric potential point via the current source IS1. A drain of the transistor M21 is commonly connected to the sources of the transistors M3 to M6 which configure the column selector CSt, and a drain of the transistor M22 is commonly connected to the sources of the transistors M7 to M10 which configure the column selector CSb.

At the time of the test mode, in a case of the write data WriteDate_Common is "1", the data WriteData_BL_t from the AND circuit AN1 becomes "0", and the data WriteData_BL_b from the AND circuit AN2 becomes "1", the transistor M21 is turned off, the transistor M22 is turned on, the write current I_WriteCurrent flows to the reference electric potential point from a selected bit line of the lower block BLb by the current source IS1, a memory cell of the memory cell array ARb is programmed to be "0", and the corresponding memory cell of the memory cell array ARt of the upper block BLt is unprogrammed to remain to be "1".

Conversely, at the time of the test mode, in a case of the write data WriteDate_Common being "0", the data WriteData_BL_t from, the AND circuit AN1 becomes "1", the data WriteData_BL_b from the AND circuit AN2 becomes "0", the transistor M21 is turned on, the transistor M22 is turned off, the write current I_WriteCurrent flows to the reference electric potential point from a selected bit line of the upper block BLt by the current source IS1, a memory cell of the memory cell array ARt is programmed to be "0", and the corresponding memory cell of the memory cell array ARb of the lower block BLb is unprogrammed to remain to be "1".

The embodiment configured in this way differs from the second embodiment in a point that at the time of programming, the write current I_WriteCurrent flows to the reference electric potential point from the selected bit line by the current source IS1 and the programming is performed. The other operations are similar to the operations of the second embodiment.

In this way, in the present embodiment, an effect similar to the effects of the first and second embodiments can be obtained.

Note that in the above described respective embodiments, the EXOR circuit is used to invert the write data WriteDate_Common, but an EXNOR circuit may be adopted, and the inversion control signal WriteData_Reverse may be inverted to be supplied to the EXNOR circuit. Further, the inversion control signal WriteData_Revers may be commonly used as the selection signal BLSel_MSB that is supplied to the terminal P6 at the time of reading.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device of a multi-block configuration that controls reading and writing of respective memory cells of first and second memory cell arrays by a common readout circuit and write circuit,
    wherein the write circuit comprises
        an inversion circuit configured by an EXOR circuit that obtains exclusive OR of write data and a signal indicating a test mode, the inversion circuit being further configured to invert the write data at a time of the test mode and output the inverted write data;
        a first switch configured to pass or stop a current for programming a first memory cell in the first memory cell array to a selected bit line of the first memory cell array;
        a second switch configured to pass or stop a current for programming a second memory cell in the second memory cell array to a selected bit line of the second memory cell array; and
        a gate circuit configured to program one of the first memory cell and the second memory cell, and unprogram another of the first memory cell and the second memory cell simultaneously, by controlling the first switch based on the write data and controlling the second switch based on the inverted write data,
    wherein the gate circuit comprises a first NAND circuit configured to control the first switch based on a signal indicating a test mode and the write data, and a second NAND circuit configured to control the second switch based on the signal indicating the test mode and the inverted write data.

2. The semiconductor memory device according to claim 1,
    wherein the first and second memory cell arrays are configured by nonvolatile memory cells.

3. The semiconductor memory device according to claim 1,
    wherein the first and second memory cell arrays are NOR-type flash memory cells.

4. The semiconductor memory device according to claim 1,
    wherein the test mode is for performing writing of a diagonal pattern.

5. A semiconductor memory device of a multi-block configuration that controls reading and writing of respective memory cells of first and second memory cell arrays by a common readout circuit and write circuit,
    wherein the write circuit comprises
        an inversion circuit configured by an EXOR circuit that obtains exclusive OR of write data and a signal indicating a test mode, the inversion circuit being further configured to invert the write data at a time of the test mode and output the inverted write data;
        a first switch configured to pass or stop a current for programming a first memory cell in the first memory cell array to a selected bit line of the first memory cell array;
        a second switch configured to pass or stop a current for programming a second memory cell in the second memory cell array to a selected bit line of the second memory cell array; and
        a gate circuit configured to program one of the first memory cell and the second memory cell, and unprogram another of the first memory cell and the second memory cell simultaneously, by controlling the first switch based on the write data and controlling the second switch based on the inverted write data,
    wherein the gate circuit comprises a first AND circuit configured to control the first switch based on a signal indicating a test mode and the write data, and a second AND circuit configured to control the second switch based on the signal indicating the test mode and the inverted write data.

6. The semiconductor memory device according to claim 5, wherein the first and second memory cell arrays are configured by nonvolatile memory cells.

7. The semiconductor memory device according to claim 5, wherein the first and second memory cell arrays are NOR-type flash memory cells.

8. The semiconductor memory device according to claim 5, wherein the test mode is for performing writing of a diagonal pattern.

* * * * *